US006297999B2

United States Patent
Kato et al.

(10) Patent No.: US 6,297,999 B2
(45) Date of Patent: Oct. 2, 2001

(54) SEMICONDUCTOR MEMORY DEVICE AND METHOD FOR SETTING STRESS VOLTAGE

(75) Inventors: Yoshiharu Kato; Satoru Kawamoto, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/784,181

(22) Filed: Feb. 16, 2001

(30) Foreign Application Priority Data

Feb. 18, 2000 (JP) .................................................. 12-041622

(51) Int. Cl.$^7$ .................................................. G11C 29/00
(52) U.S. Cl. .......................... 365/201; 365/210; 365/208; 365/190; 365/230.06; 365/149; 365/203
(58) Field of Search ...................... 365/201, 190, 365/210, 208, 230.06, 149, 150, 203

(56) References Cited

U.S. PATENT DOCUMENTS

| 5,424,988 | 6/1995 | McClure et al. ...................... 365/201 |
| 5,995,427 | * 11/1999 | Tsukikawa ............................ 365/201 |

FOREIGN PATENT DOCUMENTS

| 0 516 364 A2 | * 12/1992 | (EP) | ................................ G11C/29/00 |
| 0 581 309 A2 | * 2/1994 | (EP) | ................................ G11C/29/00 |
| 04-232693 | 8/1992 | (JP) | ................................ G11C/11/413 |
| 6-84348 | 3/1994 | (JP) | ................................ G11C/11/401 |
| 6-223595 | 8/1994 | (JP) | ................................ G11C/29/00 |
| 7-201199 | 8/1995 | (JP) | ................................ G11C/29/00 |
| 10-092197 | 4/1998 | (JP) | ................................ G11C/29/00 |
| 10-340598 | 12/1998 | (JP) | ................................ G11C/29/00 |
| 11-086597 | 3/1999 | (JP) | ................................ G11C/29/00 |
| 11-232871 | 8/1999 | (JP) | ................................ G11C/11/409 |

* cited by examiner

Primary Examiner—Andrew Q. Tran
(74) Attorney, Agent, or Firm—Arent, Fox, Kintner, Plotkin & Kahn, PLLC

(57) ABSTRACT

The present invention provides a semiconductor memory device that performs a burn-in test. The device includes word lines, pairs of bit lines, memory cells, sense amplifiers connected to the pairs of bit lines for amplifying a potential difference between the associated pair of bit lines, and a burn-in test control circuit for providing a stress voltage to the plurality of word lines and the pairs of bit lines to perform a burn-in test based on the burn-in control signal The burn-in test control circuit includes a potential difference setting circuit for selecting one of the first word lines so to generate a potential difference between at least one of the pairs of bit lines. The sense amplifiers amplify the potential difference to provide the stress voltage between the word lines and the associated pair of bit lines and between the bit lines of that pair.

19 Claims, 11 Drawing Sheets

SEMICONDUCTOR MEMORY DEVICE AND METHOD FOR SETTING STRESS VOLTAGE

BACKGROUND OF THE INVENTION

The present invention relates to a semiconductor memory device. More particularly, it relates to a semiconductor memory device provided with a burn-in test function.

In the prior art, word lines and bit lines that are connected to a memory cell in a semiconductor memory device undergo a burn-in test. The burn-in test is performed during a final testing process, which is performed after a packaging process. Further, the burn-in test takes a long time since the word lines must be sequentially accessed. However, contemporary semiconductor memory devices are often delivered to a user's plant, which are still in the form of chips before undergoing the packaging process. Consequently, the burn-in test is normally performed during a wafer testing process.

In a memory device, such as a DRAM, word lines are selected one at a time in normal operation, during which information is read from or written to memory cells. Then, among the memory cells connected to the selected word lines, information is read from or written to the memory cell that is connected to a selected column.

When performing the burn-in test during the wafer testing process, multiple word lines and bit lines are simultaneously selected, and a stress voltage is applied between the word lines and bit lines or between the bit lines for a predetermined time to shorten the burn-in test time.

Accordingly, in addition to circuits for performing normal operations, a memory device having a burn-in test function must incorporate a circuit for performing the burn-in test. A large number of such burn-in test circuits has been proposed.

For example, Japanese Unexamined Patent Publication No. 10-340598 describes a switch circuit that provides a stress voltage to each bit line from an external device based on a test mode detection signal when performing the burn-in test. Japanese Unexamined Patent Publication No. 4-232693 also describes a switch circuit having a similar function.

These burn-in test circuits require a switch circuit for each bit line and a control signal line for each switch circuit. Thus, a burn-in circuit as described significantly increases the circuit area of the memory device.

Japanese Unexamined Patent Publication 11-86597 describes a test circuit that includes a switch circuit connected to each bit line to control the potential at the bit line. When performing the burn-in test, one of the switch circuits connected to a pair of the bit lines is activated to produce a potential difference between the pair of the bit lines. A sense amplifier is then activated to provide a stress voltage to each bit line.

The above burn-in test circuit also requires a switch circuit for each bit line and a control signal line for each switch circuit. Thus, this burn-in test circuit, too, significantly increases the circuit area of the memory device.

Japanese Unexamined Patent Publication 10-92197 describes a test circuit that activates a sense amplifier with a burn-in control signal. This causes the sense amplifier to provide a stress voltage to each bit line. Although a switch circuit is not required for each bit line in this burn-in test circuit, the operation of the sense amplifier makes it difficult to control the stress voltage provided to a pair of bit lines. In other words, the potential at each bit line when the sense amplifier is activated determines which one of the bit lines takes a high potential. Therefore, although short-circuits between a pair of bit lines are screened, short-circuits between bit lines of adjacent columns may not be screened. As a result, the burn-in test reduces the screening reliability.

Japanese Unexamined Patent Publication No. 6-223595 describes a test circuit that selects every write decoder and provides a stress voltage from a write amplifier to each bit line during a burn-in test.

Further, Japanese Unexamined Patent Publication No. 11-86597 describes a test circuit that provides a stress voltage from I/O circuits to the bit lines. Cell information is provided by the input and output through the I/O circuits, when the cell information is transferred between a data bus and columns.

The circuit area of cell arrays does not have to be increased in these test circuits since the decoders or I/O circuits, which are used during normal read and write operations, are employed to provide the stress voltage. During the burn-in test, however, every one of the bit lines applies a load to the write amplifier, which provides the stress voltage to the bit lines during the burn-in test. Thus, the load applied to the write amplifier is increased. This may cause an insufficient stress voltage being provided to the bit lines during the burn-in test and consequently decrease the screening reliability.

In addition, since all of the write decoders or I/O circuits are selected, the number of inputs of each decoder must increase, for example, from three to four. If the increase in the number of inputs occurs in many decoders, the number of logic gates will increase significantly. And the circuit area of peripheral circuits in a cell array will also increase.

As such, although many memory devices equipped with a burn-in test function have been proposed, the circuit area of cell arrays is increased when a switch circuit is connected to each bit line to ensure the supply of a stress voltage to each bit line.

Further, when a stress voltage is provided to each bit line without increasing the circuit area of cell arrays, the circuit area of peripheral circuits increases and each bit line does not acquire a sufficient stress voltage.

SUMMARY OF THE INVENTION

It is an object of the present invention to provide a semiconductor memory device equipped with a burn-in test function that ensures the screening of early failures without increasing the circuit area.

To achieve the above object, the present invention provides a semiconductor memory device including a plurality of word lines having first word lines, pairs of bit lines intersecting the plurality of word lines, a plurality of memory cells located at the intersections between the plurality of word lines and the pairs of bit lines, a plurality of sense amplifiers each connected to one of the pairs of bit lines for amplifying a potential difference between the associated pair of bit lines, and a burn-in test control circuit for providing a stress voltage to the plurality of word lines and the pairs of bit lines to perform a burn-in test based on a burn-in control signal. The burn-in test control circuit includes a potential difference setting circuit for selecting at least one of the first word lines before selection of the plurality of word lines to generate a potential difference between at least one of the pairs of bit lines based on the burn-in control signal. Each of the sense amplifiers amplifies the potential difference to provide the stress voltage between the plurality of word lines and the associated pair of bit lines and between the associated pair of bit lines.

The present invention also provides a semiconductor memory device including a plurality of words lines, pairs of bit lines intersecting the word lines, a plurality of memory cells located at the intersections between the word lines and the pairs of bit lines, a plurality of sense amplifiers each connected to one of the pairs of bit lines for amplifying a potential difference between the associated pair of bit lines, a plurality of column gates each connected to one of the pairs of bit lines, a pair of data buses connected via the column gates to the pairs of bit lines, and a burn-in test control circuit for providing a stress voltage to the word lines and the pairs of bit lines to perform a burn-in test based on the burn-in control signal. The burn-in test control circuit includes a potential generation circuit connected to the pair of data buses for generating a potential difference between the data buses based on the burn-in control signal, and a column decoder connected to the column gates to connect the pair of data buses to the pairs of bit lines based on the burn-in control signal. Each of the sense amplifiers amplifies the potential difference to provide the stress voltage between the plurality of word lines and the associated pair of bit lines and between the associated pair of bit lines.

The present invention further provides a semiconductor memory device including a plurality of words lines, pairs of bit lines intersecting the word lines, a plurality of memory cells located at the intersections between the word lines and the pairs of bit lines, and a plurality of sense amplifiers each connected to one of the pairs of bit lines for amplifying a potential difference between the associated pair of bit lines. Each of the sense amplifiers includes a pair of input nodes. Plural sets of bit line separation switches are each connected between the associated pair of bit lines and the pair of input nodes of the associated sense amplifier. A burn-in test control circuit provides a stress voltage to the word lines and the pairs of bit lines to perform a burn-in test based on a burn-in control signal. The burn-in test control circuit includes a switch control circuit for activating one of the bit line separation switches associated with one of the pairs of bit lines based on the burn-in control signal, before selecting the word lines to produce a potential difference between the input nodes of the sense amplifier associated with one set of the bit line separation switches.

The present invention further provides a method for setting a stress voltage applied to a semiconductor memory device. The semiconductor memory device includes a plurality of word lines, pairs of bit lines intersecting the word lines, a plurality of dummy word lines intersecting the pairs of bit lines, and a plurality of sense amplifiers each connected to one of the pairs of bit lines for amplifying a potential difference between the associated pair of bit lines. The method includes selecting at least one of the dummy word lines, producing a potential difference between at least one of the pairs of bit lines, amplifying the potential difference by activating the sense amplifier associated with the at least one of the pairs of bit lines, selecting all of the word lines, and providing a stress voltage between all of the word lines and the at least one of the pairs of bit lines and between the at least one of the pairs of bit lines.

The present invention further provides a method for setting a stress voltage applied to a semiconductor memory device. The semiconductor memory device includes a plurality of word lines, pairs of bit lines intersecting the word lines, a plurality of dummy word lines intersecting the pairs of bit lines, a plurality of sense amplifiers each connected to one of the pairs of bit lines for amplifying a potential difference between the associated pair of bit lines, and a pair of data buses connected via the column gates to the pairs of bit lines. The method includes generating a potential difference between the pair of data buses, providing the potential difference to the pairs of bit lines by connecting the pair of data buses to the pairs of bit lines, amplifying the potential difference by activating the sense amplifiers, selecting all of the word lines, and providing a stress voltage between all of the word lines and the pairs of bit lines and between the pairs of bit lines.

The present invention further provides a method for setting a stress voltage applied to a semiconductor memory device. The semiconductor memory device includes a plurality of word lines, pairs of bit lines intersecting the word lines, a plurality of dummy word lines intersecting the pairs of bit lines, a plurality of sense amplifiers each having a pair of input nodes and connected to one of the pairs of bit lines for amplifying a potential difference between the associated pair of bit lines, and plural sets of bit line separation switches each connected to one of the pairs of bit lines and to the pair of input nodes of the associated sense amplifier. The method includes activating one set of the bit line separation switches associated with one of the pairs of bit lines to produce a potential difference between the pairs of the input nodes of the sense amplifier associated with the one set of the bit line separation switches, selecting all of the word lines, amplifying the potential difference by activating the sense amplifier associated with the one set of the bit line separation switches, and providing a stress voltage between all of the word lines and one of the pairs of bit lines and between the pairs of bit lines by activating the one set of the bit line separation switches.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may be best understood by reference to the description of the following exemplary embodiments together with the accompanying drawings in which.

DETAILED DESCRIPTION OF THE PREFERRED EMBODIMENTS

Figure 1:
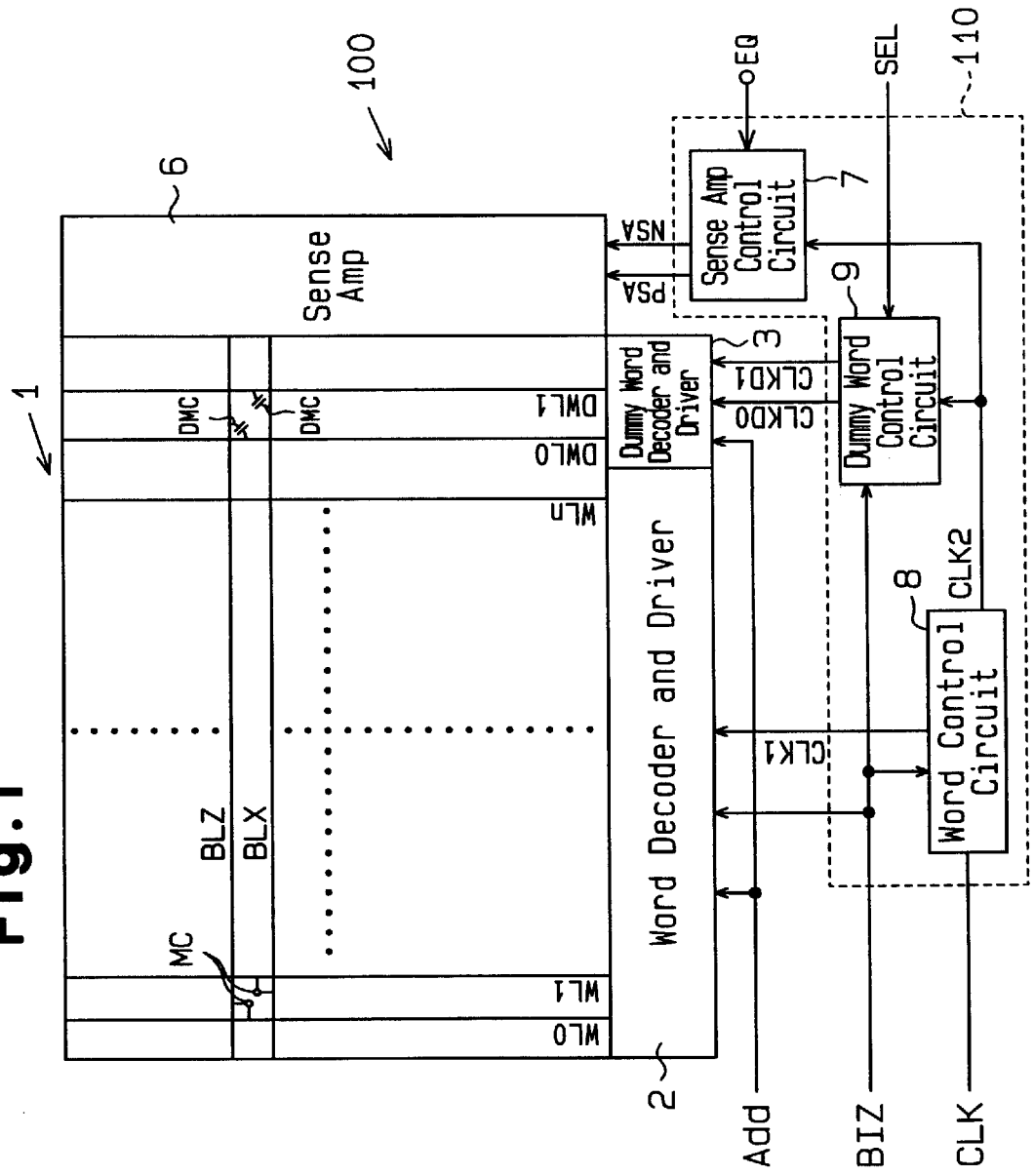
FIG. 1 is a schematic block circuit diagram of a semiconductor memory device according to a first embodiment of the present invention.

In the drawings, like numerals are used for like elements throughout.

[First Embodiment]

Figure 2:
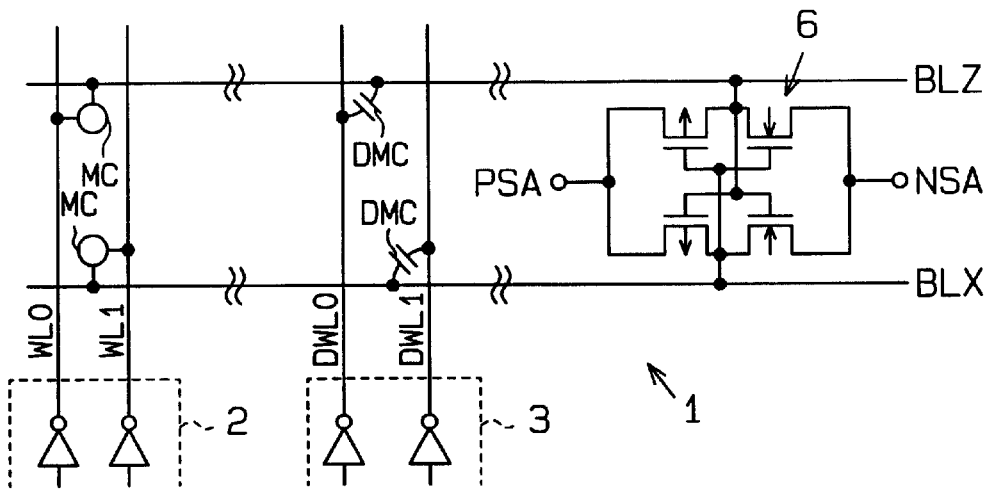
FIG. 2 is a schematic circuit diagram of a section of a memory cell array in the semiconductor memory device of FIG. 1.

FIG. 1 is a schematic block circuit diagram of a semiconductor memory device 100 according to a first embodiment of the present invention. FIG. 2 is a schematic circuit diagram showing a section of a memory cell array 1 of the semiconductor memory device 100.

The memory cell array 1 includes word lines WL0–WLn and pairs of bit lines BLZ, BLX. With reference to FIG. 2, among the word lines WL0–WLn, for example, Memory cells MC are connected respectively between the even word lines and the bit lines BLZ and between the odd word lines and the bit lines BLX.

The word lines WL0–WLn are connected to a word decoder driver 2. During normal read and write operations, the word decoder driver 2 receives an address signal Add and accordingly selects one of the word lines.

Figure 3:
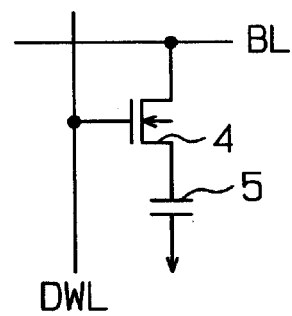
FIG. 3 is a circuit diagram of an exemplary dummy cell in the memory cell array of FIG. 2.

The memory cell array 1 also includes two dummy word lines DWL0, DWL1. Dummy cells DMC are connected respectively between the dummy word line DWL0 and the bit line BLZ and between the dummy word line DWL1 and the bit line BLX. Each dummy cell DMC is provided by a coupling capacitor. As shown in FIG. 3, a dummy cell DMC may be alternatively provided by a cell transistor 4 and a cell capacitor 5. In this case, the size of the cell capacitor 5 is one half the size of the cell capacitor in a memory cell MC.

Referring back to FIG. 1, the dummy word lines DWL0, DWL1 are connected to a dummy word decoder driver 3. During normal operation, the dummy word decoder driver 3 receives the address signal Add. The dummy word decoder driver 3, for example, selects the dummy word line DWL1 when an even word line is selected and selects the dummy word line DWL0 when an odd word line is selected.

As described in Japanese Unexamined Patent Publication Nos. 7-201199 and 6-84348, one of the dummy word lines DWL0, DWL1 is selected in accordance with the selected word line among the word lines WL0–WLn. The coupling capacitance between the selected dummy word line and bit line increases the potential difference between the pair of bit lines from which cell information is read. This stabilizes the read operation and obtains a margin for refresh operations.

A sense amplifier 6 is connected between each pair of the bit lines BLZ, BLX. Each sense amplifier 6 is activated by sense amplifier voltages PSA, NSA supplied by a sense amplifier control circuit 7, and further amplifies the potential difference between the associated pair of bit lines BLZ, BLX.

A word control circuit 8, which controls the selection of the word lines WL0–WLn, receives a master clock signal CLK from an external device (not shown) and a burn-in control signal BIZ during a burn-in test. The word control circuit 8 provides a first clock signal CLK1 to the word decoder driver 2, and a second clock signal CLK2 to the dummy word control circuit 9 and to the sense amplifier control circuit 7.

The word decoder driver 2 is also provided with the burn-in control signal BIZ. During normal operation, the word decoder driver 2 selects one of the word lines WL0–WLn based on the address signal Add and the first clock signal CLK1. During the burn-in test, the word decoder driver 2 simultaneously selects all of the word lines WL0–WLn based on the burn-in control signal BIZ.

The dummy word control circuit 9 receives the second clock signal CLK2, the burn-in control signal BIZ, and a selection signal SEL. Based on the received signals, the dummy word control circuit 9 generates first and second output clock signals CLKD0, CLKD1 and provides the clock signals CLKD0, CLKD1 to the dummy word decoder driver 3.

The sense amplifier control circuit 7, the word control circuit 8, and the dummy word control circuit 9 constitute a burn-in test control circuit 110.

The circuits 7, 8, 9 of the burn-in test control circuit 110 will now be discussed.

Figure 4:
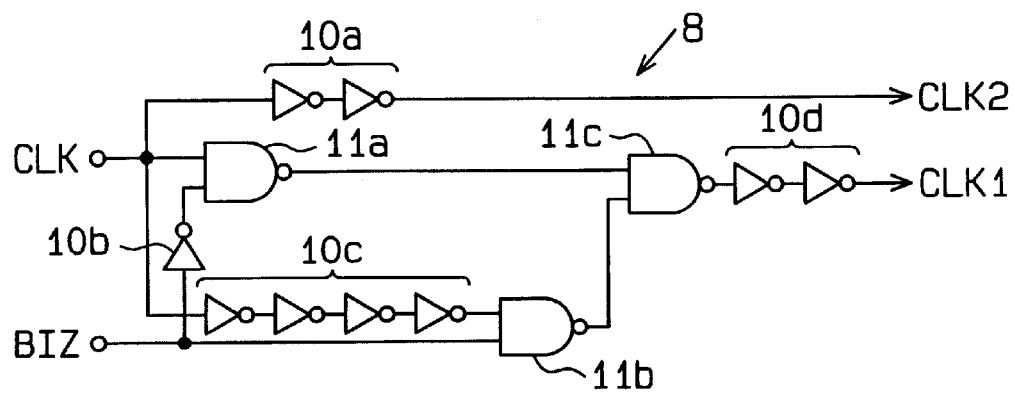
FIG. 4 is a schematic circuit diagram of a word control circuit in the semiconductor memory device of FIG. 1.

FIG. 4 is a schematic circuit diagram of the word control circuit 8. The word control circuit 8 includes inverter circuits 10a, 10b, 10c, 10d and NAND circuits 11a, 11b, 11c.

The inverter circuit 10a, which includes two inverters, delays the master clock signal CLK received from an external device and generates the second clock signal CLK2.

The NAND circuit 11a receives the master clock signal CLK and the burn-in control signal BIZ which is inverted by the inverter circuit 10b. The NAND circuit 11a performs a NAND logic operation and provides the logic operation result to the NAND circuit 11c. The NAND circuit 11b receives the burn-in control signal BIZ and the master clock signal CLK via the inverter circuit 10c which includes an even number (e.g., four in the first embodiment) of inverters. The NAND circuit 11b performs a NAND logic operation and provides the logic operation result to the NAND circuit 11c.

The NAND circuit 11c performs a NAND logic operation based on the output signals received from the NAND circuits 11a, 11b. The logic operation result is then provided to the inverter circuit 10d. The inverter circuit 10d, which includes two inverters, receives the output signal of the NAND circuit 11c and generates the first clock signal CLK1.

During normal operation, the word control circuit 8 receives the burn-in control signal BIZ at a low level. This causes the output signal of the NAND circuit 11b to go high and the output signal of the inverter circuit 10b to go high. In this state, the master clock signal CLK is routed through the inverter circuit 10a to generate the second clock signal CLK2. Thus, the first clock signal CLK1 is delayed from the second clock signal CLK2.

During the burn-in test, the word control circuit 8 receives the burn-in control signal BIZ at a high level. This causes the output signal of the NAND circuit 11a to go high. Thus, the master clock signal CLK is routed through the inverter circuit 10c, the NAND circuits 11b, 11c, and the inverter circuit 10d to generate the first clock signal CLK1. Accordingly, the time delay of the first clock signal CLK1 relative to the second clock signal CLK2 during the burn-in test is longer than that during normal operation.

Figure 5:
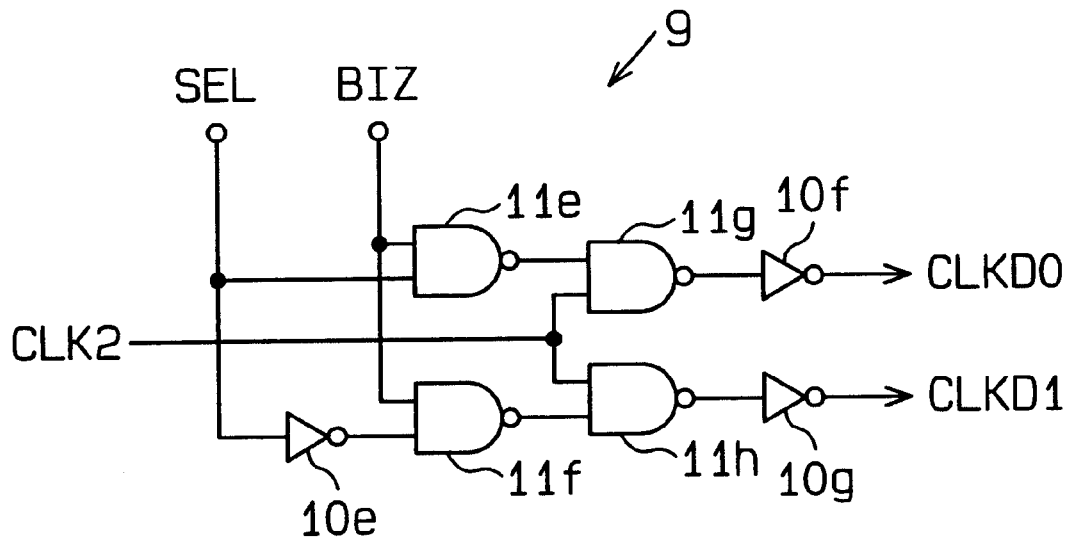
FIG. 5 is a schematic circuit diagram of a dummy word control circuit in the semiconductor memory device of FIG. 1.

FIG. 5 is a schematic circuit diagram of the dummy word control circuit 9. The dummy word control circuit 9 includes inverter circuits 10e, 10f, 10g and NAND circuits 11e, 11f, 11g, 11h.

The NAND circuit 11e receives the burn-in control circuit BIZ and the selection signal SEL, and performs a NAND logic operation. The NAND circuit 11f receives the burn-in control signal BIZ and the selection signal SEL which is inverted by the inverter circuit 10e, and performs a NAND logic operation.

The NAND circuit 11g receives the output signal of the NAND circuit 11e and the second clock signal CLK2, and performs a NAND logic operation. The NAND circuit 11h receives the output signal of the NAND circuit 11f and the second clock signal CLK2, and performs a NAND logic operation.

The inverter circuit 10f receives the output signal of the NAND circuit 11g and generates the first dummy clock signal CLKD0. The inverter circuit 10g receives the output signal of the NAND circuit 11h and generates the second dummy clock signal CLKD1.

During normal operation, the dummy word control circuit 9 receives a low burn-in control signal BIZ. In this state, the output signals of the NAND circuits 11e, 11f go high. Thus, the phases of the first and second dummy clock signals CLKD0, CLKD1 are equal to the phase of the second clock signal CLK2.

During the burn-in test, the dummy word control circuit 9 receives a high burn-in control signal BIZ. This shifts the levels of the signals output from the NAND circuits 11e, 11f and causes the output signals of the NAND circuits 11e, 11f to have inverted phases.

When one of the first and second dummy clock output signals CLKD0, CLKD1 goes low, the other one of the first and second dummy clock output signals CLKD0, CLKD1 has the same phase as the second clock signal CLK2.

Figure 6:
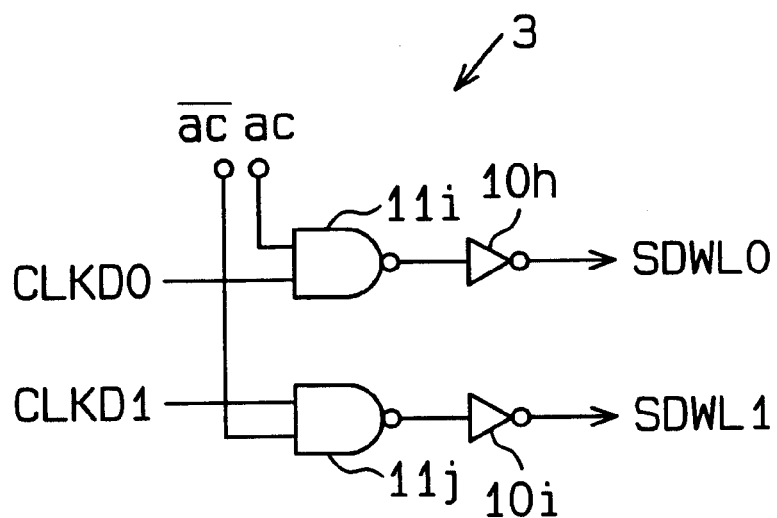
FIG. 6 is a schematic circuit diagram of a dummy word decoder and a driver in the semiconductor memory device of FIG. 1.

FIG. 6 is a schematic circuit diagram of the dummy word decoder driver 3. The dummy word decoder driver 3 includes NAND circuits 11i, 11j and inverter circuits 10h, 10i.

The NAND circuit 11i receives the first dummy clock signal CLKD0 and an address determination signal ac and performs a NAND logic operation. The inverter circuit 10h receives the output signal of the NAND circuit 11i and generates a first dummy word line selection signal SDWL0, which selects the dummy word line DWL0.

The NAND circuit 11j receives the second dummy clock output signal CLKD1 and an address determination signal /ac and performs a NAND logic operation. The inverter circuit 10i receives the output signal of the NAND circuit 11j and generates a second dummy word line selection signal SDWL1, which selects the dummy word line DWL1.

During normal operation, the address determination signals ac, /ac have inverted phases. For example, the address determination signal ac is high when an even word line is selected, and the address determination signal /ac is high when an odd word line is selected. During the burn-in test, the address determination signals ac, /ac are both high.

During normal operation, based on the address of the selected word line, the dummy word decoder driver 3 inverts one of the dummy word line selection signals SDWL0, SDWL1 when the first and second dummy clock signals CLKD0, CLKD1 are inverted.

During the burn-in test, the dummy word decoder driver 3 inverts one of the dummy word line selection signals SDWL0, SDWL1 when one of first and second dummy clock signals CLKD0, CLKD1 is inverted.

Figure 7:
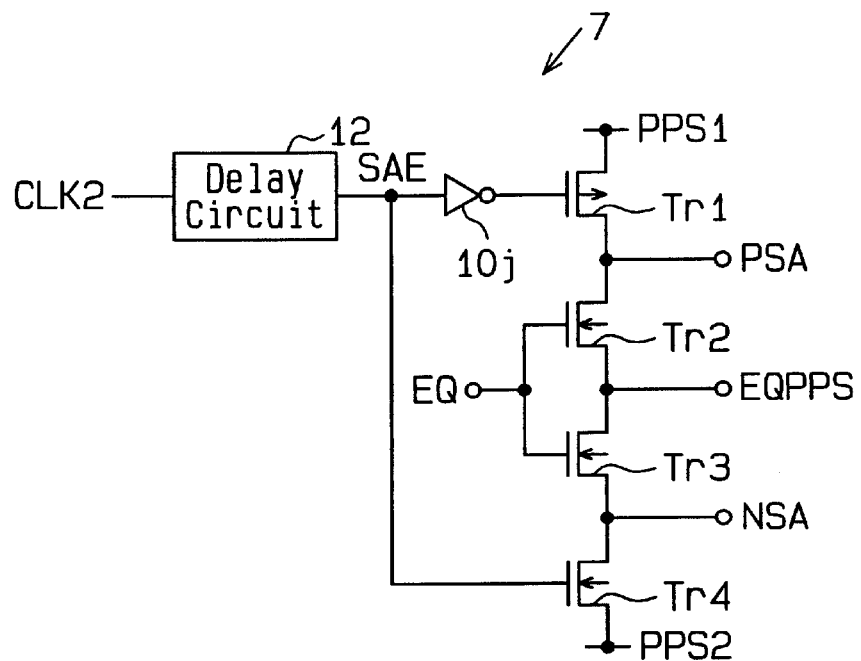
FIG. 7 is a schematic circuit diagram of a sense amplifier control circuit in the semiconductor memory device of FIG. 1.

FIG. 7 is a schematic circuit diagram of the sense amplifier control circuit 7. The sense amplifier control circuit 7 includes a delay circuit 12, an inverter circuit 10j, a p-channel MOS transistor Tr1, and n-channel MOS transistors Tr2–Tr4.

The delay circuit 12 receives the second clock signal CLK2, delays the clock signal CLK2 by a predetermined time, and generates a sense amplifier activation signal SAE.

The p-channel MOS transistors Tr1 and the n-channel MOS transistors Tr2–Tr4 are connected in series between a high potential power supply PPS1 and a low potential power supply PPS2. The sense amplifier activation signal SAE is provided to the gate of the transistor Tr1 via the inverter 10j and to the gate of the transistor Tr4. An equalizing signal EQ is provided to the gates of the transistors Tr2, Tr3.

The drains of the transistors Tr1, Tr2 output a first sense amplifier voltage PSA, and the drain of the transistor Tr4 outputs a second sense amplifier voltage NSA. Further, a precharge voltage EQPPS is output from a node between the transistors Tr2, Tr3. During the burn-in test, the power supplies PPS1, PPS2 are each provided with a power supply voltage that produces a potential difference between the power supplies PPS1, PPS2, which is greater than that during normal operation.

When the sense amplifier activation signal SAE goes high, the transistors Tr1, Tr4 are activated. In this state, the equalizing signal EQ remains low. As a result, the value of the first sense amplifier voltage PSA becomes equal to the voltage value of the high potential power supply PPS1, and the value of the second sense amplifier voltage NSA becomes equal to the voltage value of the low potential power supply PPS2. This activates the sense amplifier 6 (see FIG. 1).

When the sense amplifier activation signal SAE goes low, the transistors Tr1, Tr4 are deactivated. In this state, the equalizing signal EQ goes high, and the transistors Tr2, Tr3 are activated. This causes the precharge voltage EQPPS to become equal to a median level between the voltages of the power supplies PPS1, PPS2.

The time delay produced by the delay circuit 12 is set such that during normal operation, the sense amplifier 6 is activated after a predetermined time has elapsed from the time when a word line is selected.

Figure 8:
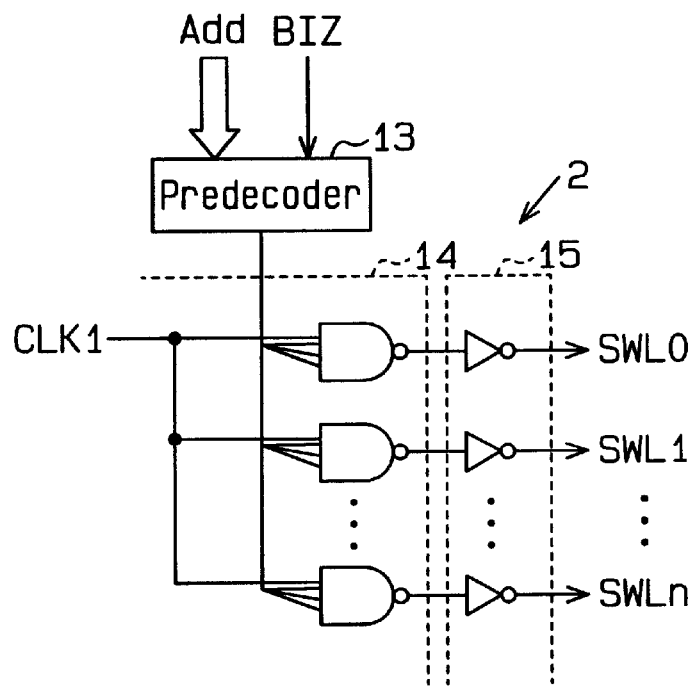
FIG. 8 is a schematic circuit diagram of a word decoder and a driver in the semiconductor memory device of FIG. 1.

FIG. 8 is a schematic circuit diagram of the word decoder driver 2. The word decoder driver 2 includes a predecoder 13, a main decoder 14 having a plurality of NAND circuits, and a driver 15 having a plurality of inverter circuits.

The predecoder 13 receives the address signal Add and the burn-in control signal BIZ and generates predecoding signals. Each NAND circuit in the main decoder 14 receives the predecoding signals and the first clock signal CLK1, and performs a NAND logic operation.

The output signal of each NAND circuit is provided to the associated inverter circuit in the driver 15. The inverter circuits invert the output signals of the associated NAND circuits and generate word line selections signals SWL0–SWLn for selecting the word lines WL0–WLn.

During normal operation, when the word decoder driver 2 receives the address signal Add and the first clock signal CLK1 goes high, the word decoder driver 2 causes one of the word line selection signals SWL0–SWLn to go high based on the address signal Add.

During the burn-in test, the word decoder driver 2 causes all of the predecoding signals to go high when the burn-in control signal BIZ goes high, and causes all of the word line selection signals SWL0–SWLn to go high when the first clock signal CLK1 goes high. As a result, all of the word lines WL0–WLn are selected.

In the first embodiment, during the burn-in test, the first clock signal CLK1 is provided to the word decoder driver 2 at a time later than during normal operation. Thus, one of the dummy word selection lines DWL0, DWL1 is selected in response to the second clock signal CLK2, and the sense amplifier 6 is then activated. Subsequently, all of the word lines WL0–WLn are simultaneously activated.

Figure 9:
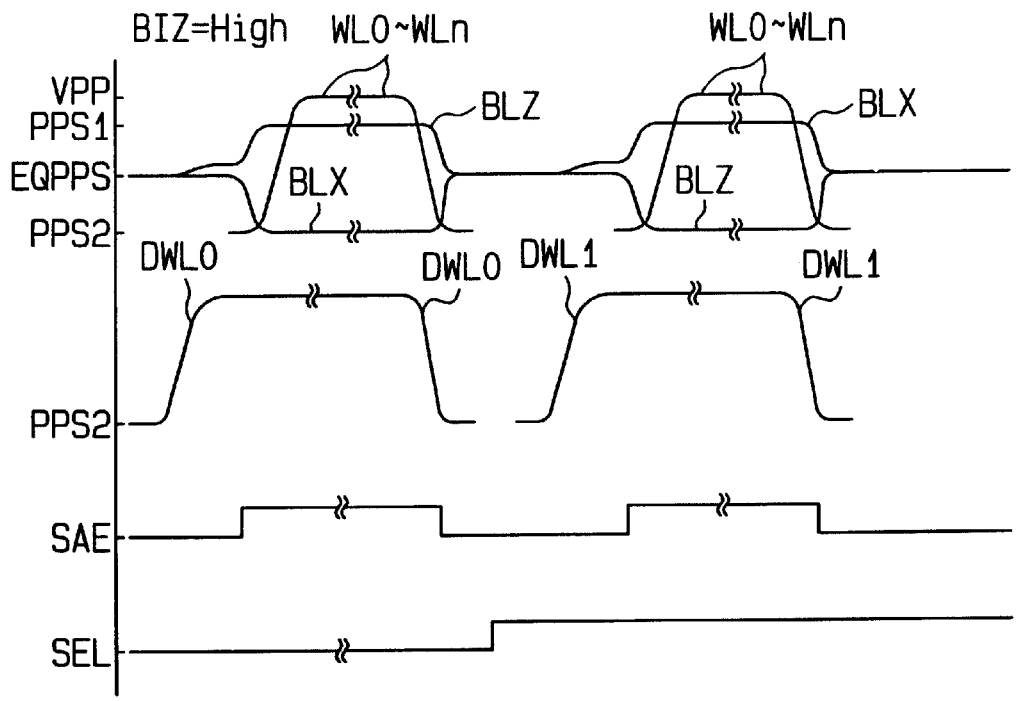
FIG. 9 is a combined timing and waveform chart illustrating the operation of the semiconductor memory device of FIG. 1 during a burn-in test.

The operation of the semiconductor memory device (DRAM) 100 of the first embodiment will now be discussed. FIG. 9 is a combined timing and waveform chart illustrating the operation of the semiconductor memory device 100 during the burn-in test.

During the burn-in test, the high burn-in control signal BIZ is provided to the semiconductor memory device 100 from an external device. In this state, when the selection signal SEL goes low, the first dummy word line selection signal SDWL0 alternatively goes high and low based on the second clock signal CLK2. The second dummy word selection signal SDWL1 remains low.

The first dummy word line DWL0 is selected when the second clock signal CLK2 goes high. As a result, the capacitive coupling between the dummy word line DWL0 and the bit line BLZ slightly increases the potential at the bit line BLZ and produces a small potential difference between the bit lines BLZ, BLX.

After the first dummy word line DWL0 is selected, the sense amplifier activation signal SAE goes high. This activates the sense amplifier 6 and increases the potential difference between the pair of bit lines BLZ, BLX to the potential difference between the power supplies PPS1, PPS2.

Then, the word decoder driver 2 selects all of the word lines WL0, WLn based on the first clock signal CLK1, which is provided by the word control circuit 8. In this state, a stress voltage is provided respectively between the bit line BLX and the word lines WL0–WLn and between the bit lines BLZ, BLX.

Subsequently, when the second clock signal CLK2 goes low, the selection of the first dummy word line DWL0 ends and the sense amplifier 6 is deactivated. The sense amplifier control circuit 7 precharges the bit lines BLZ, BLX to a median level between the power supplies PPS1, PPS2.

While the selection signal SEL continues to remain low, the first dummy word line DWL0 is repetitively selected.

After the selection signal SEL is maintained at the low level for a predetermined time period, the selection signal SEL goes high. In this state, the dummy word line selection signal SDWL1 alternatively goes high and low based on the second clock signal CLK2, and the dummy word line selection signal SDWL0 remains low.

When the second clock signal CLK2 goes high, the dummy word line DWL1 is selected, and the capacitive coupling between the second dummy word line DWL1 and the bit line BLX increases the potential at the bit line BLX.

Subsequent to the selection of the second dummy word line DWL1, the sense amplifier activation signal SAE goes high. This activates the sense amplifier 6 and increases the potential difference between the pair of bit lines BLX, BLZ to the potential difference between the power supplies PPS1, PPS2.

Then, the word decoder driver 2 selects all of the word lines WL0–WLn based on the first clock signal CLK1 provided by the word control circuit 8. In this state, a stress voltage is provided between the bit line BLZ and the word lines WL0–WLn and between the bit lines BLZ, BLX.

When the second clock signal CLK2 goes low, the selection of the second dummy word line DWL1 ends and the sense amplifier 6 is deactivated. The sense amplifier control circuit 7 precharges the bit lines BLZ, BLX to the median level between the power supplies PPS1, PPS2.

While the selection signal SEL remains high, the second dummy word line DWL1 is repetitively selected.

Figure 10:
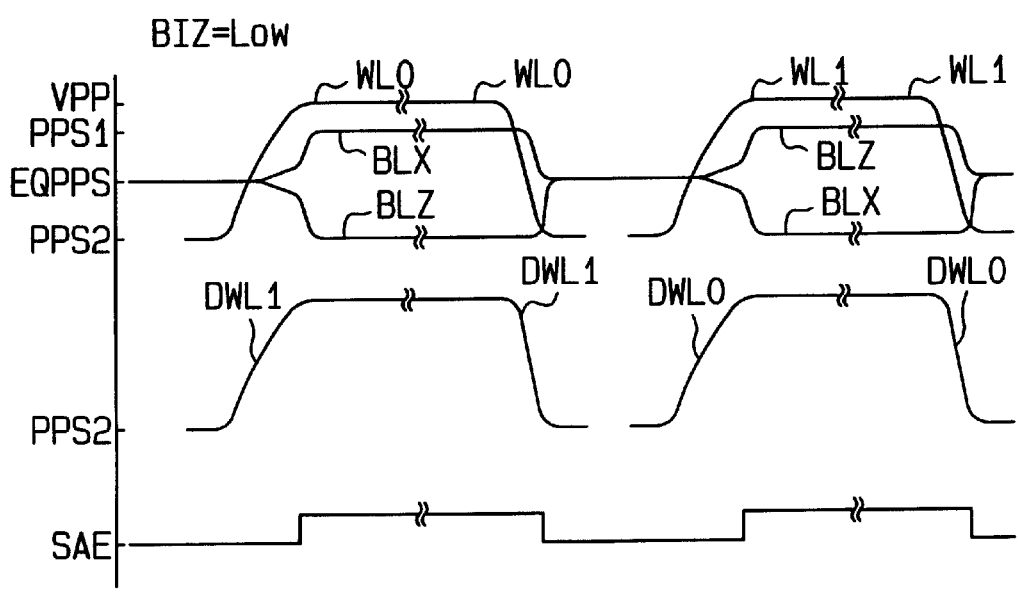
FIG. 10 is a combined timing and waveform chart illustrating the operation of the semiconductor memory device of FIG. 1 during a normal read operation.

FIG. 10 is a combined timing and waveform chart illustrating the operation of the semiconductor memory device 100 during a normal read operation.

During the normal read operation, a low burn-in control signal BIZ is provided to the semiconductor memory device 100 from an external device. This matches the phases of the first and second dummy clock signals CLKD0, CLKD1 and selects one of the first and second dummy word lines DWL0, DWL1 based on the address determination signals ac, /ac.

Further, based on the master clock signal CLK and the address signal Add, one of the word lines WL0–WLn is selected at substantially the same time as the selection of the dummy word lines DWL0, DWL1.

Cell information is read from the selected memory cell MC to one of the bit lines BLZ, BLX. Further, the capacitive coupling of the dummy cell increases the potential difference between the bit lines BLZ, BLX.

The sense amplifier 6 is then activated based on the sense amplifier activation signal SAE. This amplifies the cell information read to the bit lines BLZ, BLX.

The semiconductor memory device 100 of the first embodiment has the advantages described below.

(1) The semiconductor memory device 100 generates a stress voltage based on the burn-in control signal BIZ and the master clock signal CLK. The stress voltage is provided to the sense amplifier 6 to perform the burn-in test.

(2) During the burn-in test, the selection signal SEL switches between the dummy word lines DWL0, DWL1 to select one of the bit lines BLZ, BLX that has a high potential. Thus, the selection of the high potential bit line is facilitated.

(3) A switch circuit for providing a stress voltage to the vicinity of the bit lines BLZ, BLX and a signal line for controlling the switch circuit is not necessary. Thus, the circuit area of the memory cell array is decreased.

(4) The sense amplifier 6, which is located between the bit lines BLZ, BLX, provides a stress voltage to the bit lines BLZ, BLX. This provides a stable stress voltage to the bit lines BLZ, BLX and increases the reliability of the burn-in test.

(5) The number of column decoder input gates does not have to be increased in order to provide a stress voltage to the bit lines. Thus, the circuit area of the column decoder does not have to be increased.

[Second Embodiment]

Figure 11:
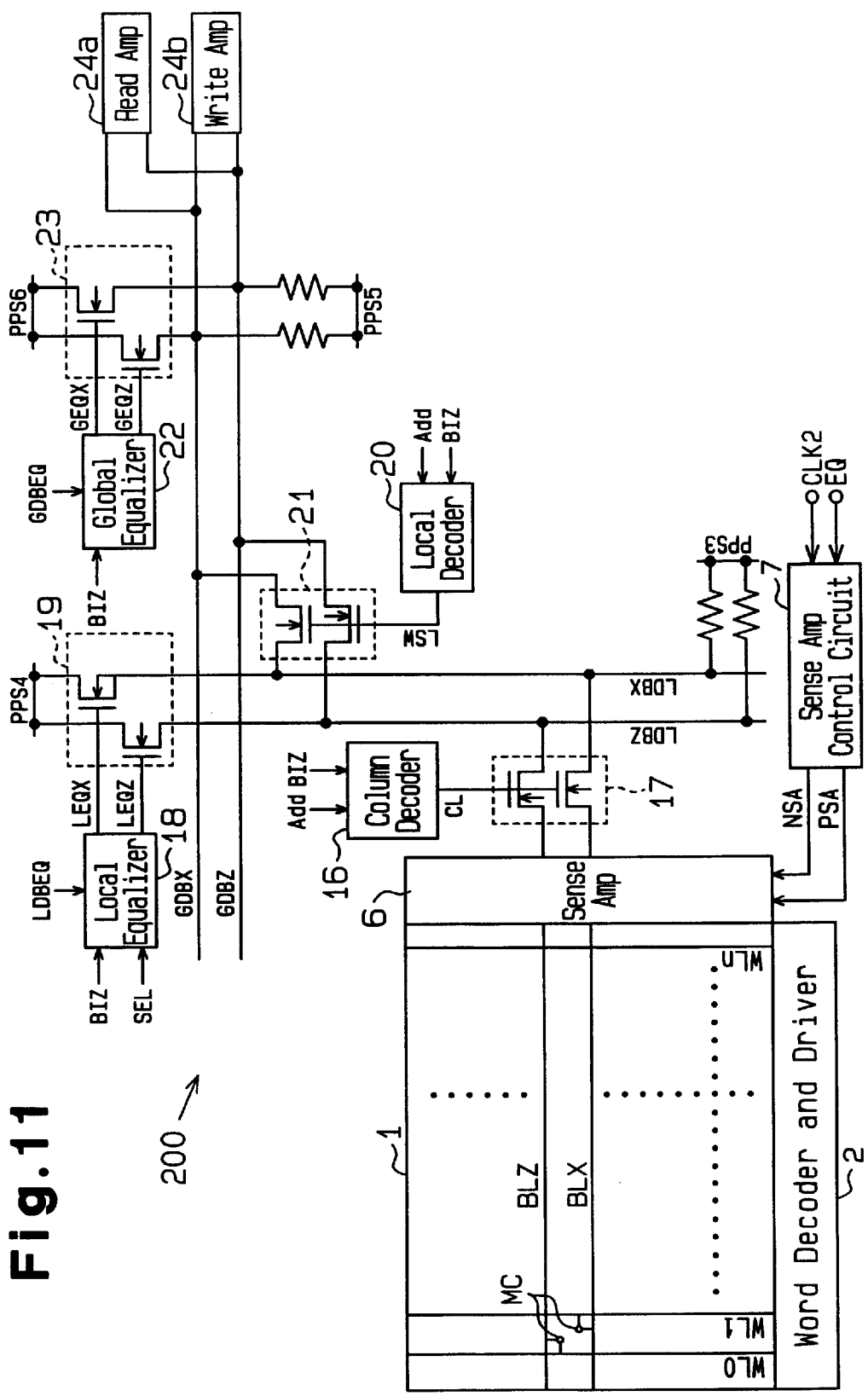
FIG. 11 is a schematic block circuit diagram of a semiconductor memory device according to a second embodiment of the present invention.

FIG. 11 is a schematic circuit diagram of a semiconductor memory device 200 according to a second embodiment of the present invention. The second burn-in test control circuit of the second embodiment includes a column decoder 16 and a local equalizer 18.

The memory cell array 1 of the semiconductor memory device 200 has a configuration that is equivalent to that of the memory cell array 1 of the semiconductor memory device 100 of the first embodiment. The dummy word lines do not affect the second embodiment. Thus, the memory cell array 1 and the dummy word lines will not be described below. Further, the peripheral circuits, including the word decoder driver 2, the sense amplifier control circuit 7, the word control circuit 8 and the dummy word control circuit 9, are similar to those in the first embodiment. Thus, these circuits will not be described in detail.

The sense amplifier control circuit 7 is equivalent to that in the first embodiment. The second clock signal CLK2, generated by the word control circuit 8 of FIG. 4, is constantly provided to the sense amplifier control circuit 7.

Pairs of bit lines BLZ, BLX (only one pair is shown in FIG. 11) are connected to a switch circuit 17. The switch circuit 17 is opened and closed by an output signal CL of the column decoder 16. Local data buses LDBZ, LDBX (only one pair is shown in FIG. 11) are respectively connected to the bit lines BLZ, BLX via the switch circuit 17.

The column decoder 16 is configured by eliminating the driver 15 from the word decoder driver 2 of FIG. 8. The column decoder 16 receives the address signal Add and the burn-in control signal BIZ.

During normal operation, the column decoder 16 connects one pair of the bit lines BLZ, BLX to the associated pair of the local data buses LDBZ, LDBX based on the address signal Add. During the burn-in test, the column decoder 16 receives a high burn-in control signal BIZ and simultaneously connects every pair of the bit lines BLZ, BLX to the associated local data buses LDBZ, LDBX.

The local data buses LDBZ, LDBX are connected to a power supply PPS3 via high resistance resistors. The local data buses LDBZ, LDBX are also connected to a power supply PPS4 via a switch circuit 19, which is opened and closed by output signals LEQZ, LEQX of the local equalizer 18.

The potential at the power supply PPS4 is higher than that at the power supply PPS3. Further, the power supply PPS4 precharges the local data buses LDBZ, LDBX before the normal read operation.

The local equalizer 18 receives a local equalizing signal LDBEQ, a burn-in control signal BIZ, and a selection signal SEL. The local equalizer 18 has a circuit configuration equivalent to that of the dummy word control circuit 9 of FIG. 5. The local equalizing signal LDBEQ is provided in lieu of the second clock signal CLK2 to the local equalizer 18.

During normal operation, the local equalizer 18 receives the burn-in control signal BIZ at a low level and the local equalizing signal LDBEQ at a high level. This causes both output signals LEQZ, LEQX of the local equalizer 18 to go high. As a result, the two transistors in the switch circuit 19 are activated, and the local data buses LDBZ, LDBX are precharged to the level of the power supply PPS4.

During the burn-in test, when the burn-in control signal BIZ received by the local equalizer 18 goes high, one of the output signals LEQZ, LEQX goes high and the other goes low. In other words, only one of the two transistors of the switch circuit 19 is activated. The transistor that is to be activated in the switch circuit 19 is determined by the selection signal SEL.

When one of the transistors in the switch circuit 19 is activated, a small potential difference that is substantially equal to the potential difference between the power supplies PPS4, PPS3 is produced between the local data bus pairs LDBZ, LDBX.

The local data buses LDBZ, LDBX are respectively connected to global data buses GDBZ, GDBX via a switch circuit 21. The switch circuit 21 is opened and closed by an output signal LSW of a local decoder 20.

The local decoder 20 receives the address signal Add and the burn-in control signal BIZ. During normal operation, based on the address signal Add, one pair of the local data buses LDBZ, LDBX is connected to the global data buses GDBZ, GDBX.

Further, during the burn-in test, when the local decoder 20 receives a high burn-in control signal BIZ, the local decoder 20 activates the switch circuit 21 and connects all of the local data bus lines LDBZ, LDBX to the global data buses GDBZ, GDBX.

The global data buses GDBZ, GDBX are connected to a power supply PPS6 via a switch circuit 23 and to a power supply PPS5 via high resistance resistors. The switch circuit 23 is opened and closed based on the output signals GEQZ, GEQX of a global equalizer 22.

The global equalizer 22 receives an equalizing signal GDBEQ and the burn-in control signal BIZ. The circuit configuration of the global equalizer 22 is equivalent to that of the dummy word control circuit 9 of FIG. 5. The global equalizing signal GDBEQ is provided in lieu of the second clock signal CLK2 to the global equalizer 22. Further, the selection signal SEL provided to the input terminals of the NAND circuits 11e, 11f (in FIG. 5) remains high.

During normal operation, for example, when the global equalizing signal GDBEQ goes high, both of the output signals GEQZ, GEQX of the global equalizer 22 goes high. This activates the switch circuit 23. Thus, the global data buses GDBZ, GDBX are precharged to the level of the power supply PPS6.

During the burn-in test, when the burn-in control signal BIZ goes high, both of the output signals GEQZ, GEQX go low. This deactivates the switch circuit 23. Thus, the global data buses GDBZ, GDBX are disconnected from the power supply PPS6.

A read amplifier 24a and a write amplifier 24b are connected to the global data buses GDBZ, GDBX.

The operation of the semiconductor memory device (DRAM) 200 of the second embodiment will now be discussed.

During the burn-in test, a small potential difference, which is substantially equal to the potential difference between the power supplies PPS4, PPS3, is produced between the local data bus pairs LDBZ, LDBX by the local equalizer 18 based on a high burn-in control signal BIZ.

In this state, the global equalizer 22 deactivates the switch circuit 23. This prevents interference between the global data buses GDBZ, GDBX and the local data buses LDBZ, LDBX.

Further, the column decoder 16 selects and connects to the local data bus lines LDBZ, LDBX all of the bit lines BLZ, BLX. This causes the small potential difference between the associated local data buses LDBZ, LDBX to be applied between the bit lines BLZ, BLX.

Then, the sense amplifier 6 is activated and all of the word lines WL0–WLn are simultaneously selected to perform the burn-in test. Further, one of the bit lines BLZ, BLX that is to have a high potential is selected based on the selection signal SEL.

During the normal read operation, a certain word line and column are selected based on the address signal Add to read data to the associated bit lines BLZ, BLX from the corresponding memory cells MC. The sense amplifier 6 then amplifies the cell information and provides the amplified cell information to the read amplifier 24a via the local data buses LDBZ, LDBX and the global data buses GDBZ, GDBX. The read data amplified by the read amplifier 24a is output to an external device.

During the normal write operation, the write data received by the write amplifier 24b from an external device is provided to the bit lines BLZ, BLX of the column selected by the address signal Add via the global data buses GDBZ, GDBX and the local data buses LDBZ, LDBX. The write data received by the bit lines BLZ, BLX is amplified by the sense amplifier 6 and written to the memory cell MC of the selected word line.

The semiconductor memory device 200 has the advantages described below.

(1) The semiconductor memory device 200 generates a stress voltage based on the burn-in control signal BIZ and the master clock signal CLK. The stress voltage is provided to the sense amplifier 6 to perform the burn-in test.

(2) During the burn-in test, the selection signal SEL is switched from a high level to a low level. This selects one of the bit lines BLZ, BLX that is to have the high potential.

(3) A switch circuit for providing a stress voltage to the vicinity of the bit lines BLZ, BLX and a signal line for controlling the switch circuit is not necessary. Thus, the circuit area of the memory cell array is decreased.

(4) The sense amplifier 6, which is located between the pair of bit lines BLZ, BLX, provides a stress voltage to the bit lines BLZ, BLX. This provides a stable stress voltage to the bit lines BLZ, BLX and increases the reliability of the burn-in test.

[Third Embodiment]

Figure 12:
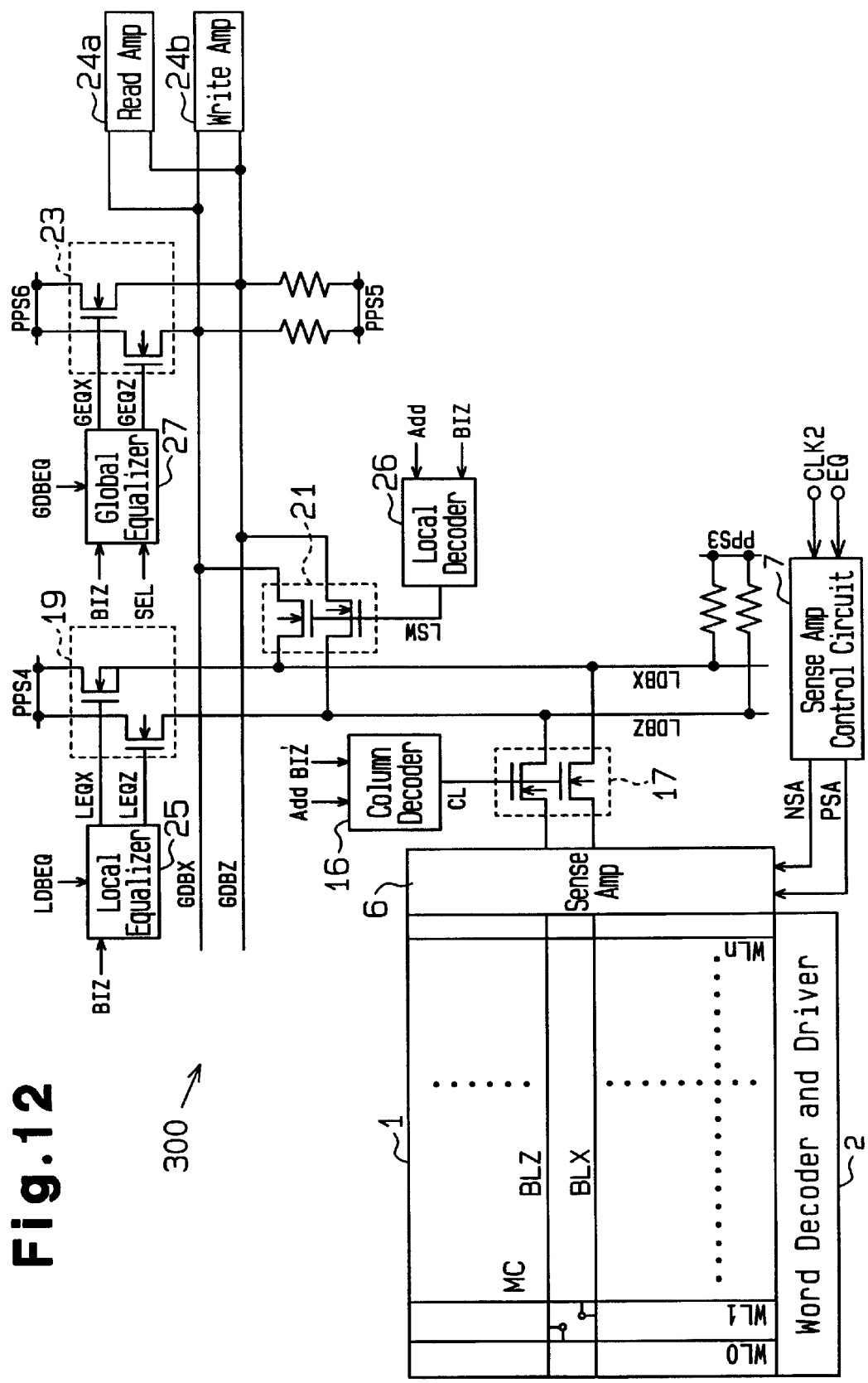
FIG. 12 is a schematic block circuit diagram of a semiconductor memory device according to a third embodiment of the present invention.

FIG. 12 is a schematic block circuit diagram of a semiconductor memory device 300 according to a third embodiment of the present invention.

The semiconductor memory device 300 of the third embodiment uses a global equalizer 27 in lieu of the local equalizer 25 to produce a predetermined potential difference between the local data bus lines LDBZ, LDBX during the burn-in test. The burn-in test control circuit of the third embodiment includes a column decoder 16 and the global equalizer 27.

The configuration of the column decoder 16 is similar to that in the second embodiment. The configuration of the local equalizer 25 is similar to that of the global equalizer 22 in the second embodiment, and the local equalizer 25 is provided with the equalizing signal LDBEQ and the burn-in control signal BIZ.

During normal operation, the local equalizer 25 precharges the local data buses LDBZ, LDBX based on the equalizing signal LDBEQ. During the burn-in test, the local equalizer 25 deactivates the switch circuit 19 when the burn-in control signal BIZ goes high and disconnects the local data buses LDBZ, LDBX from the power supply PPS4.

During normal operation, a local decoder 26 connects one pair of the local data buses LDBZ, LDBX to the global data buses GDBZ, GDBX based on the address signal Add. During the burn-in test, the local decoder 26 receives a high burn-in control signal BIZ and connects all of the local data buses LDBZ, LDBX to the global data buses GDBZ, GDBX.

The configuration of the global equalizer 27 is similar to the local equalizer 18 in the second embodiment. During normal operation, the global equalizer 27 precharges the local data buses GDBZ, GDBX to the level of the power supply PPS6 based on the global equalizing signal GDBEQ. During the burn-in test, based on the burn-in control signal BIZ and the selection signal SEL, the global equalizer 27 changes the voltage of one of the global data buses GDBZ, GDBX to the level of the power supply PPS6 and changes the voltage of the other one of the global data buses GDBZ, GDBX to the level of the power supply PPS5.

Accordingly, in the semiconductor memory device 300, during the burn-in test, the global equalizer 27 produces a small potential difference between the global data buses GDBZ, GDBX that is substantially equal to the potential difference between the power supplies PPS6, PPS5.

Further, the local decoder 26 connects all of the local data buses LDBZ, LDBX to the global data buses GDBZ, GDBX. The column decoder 16 connects all of the bit lines BLZ, BLX to the local data buses LDBZ, LDBX.

Therefore, the small potential difference between the global data buses GDBZ, GDBX becomes substantially equal to the potential difference between the bit lines BLZ, BLX. When the sense amplifier 6 is activated, all of the word lines WL0–WLn are simultaneously selected to perform the burn-in test. Further, the selection signal SEL provided to the global equalizer 27 determines which one of the bit lines BLZ, BLX is to have the high potential.

The normal write and read operations are performed in the same manner as in the second embodiment.

The semiconductor memory device 300 of the third embodiment further has the following advantages.

(1) The number of global equalizers 27, which has input gates to receive the burn-in control signal BIZ and the selection signal SEL, is less than that of the local equalizer 25. Accordingly, the circuit area of peripheral circuits in the third embodiment is smaller than the circuit area of peripheral circuits in the second embodiment.

[Fourth Embodiment]

Figure 13:
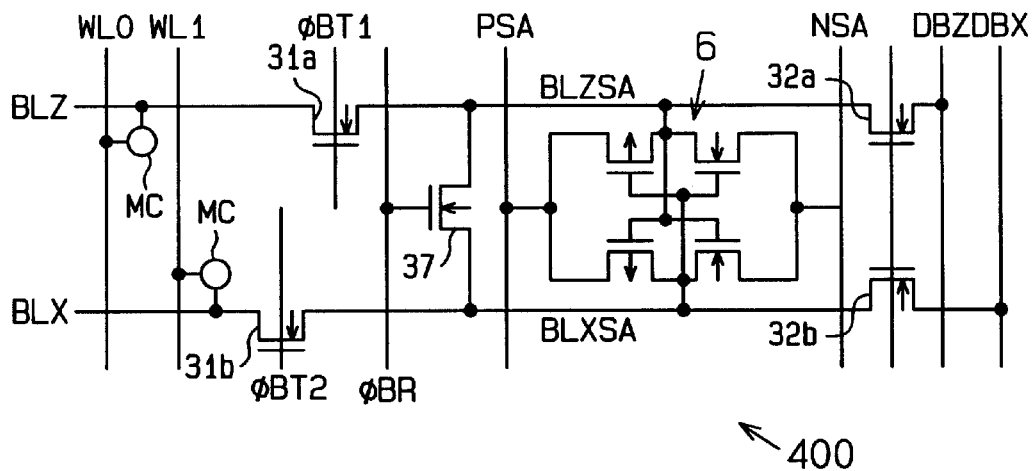
FIG. 13 is a schematic block circuit diagram of a section of a memory array in a semiconductor memory device according to a fourth embodiment of the present invention.

FIG. 13 is a schematic circuit diagram of a memory cell array 400 of a semiconductor memory device according to a fourth embodiment of the present invention. The burn-in test control circuit of the fourth embodiment includes a first switch control circuit and a second switch control circuit.

FIG. 13 illustrates a DRAM having bit line separation switches 31a, 31b located between the bit lines BLZ, BLX. Such a DRAM is described, for example, in Japanese Unexamined Patent Publication No. 11-232871.

The read operation of the DRAM will now be described. For example, when the word line WL0 is selected, only the bit line separation switch 31a is activated, and cell information is provided from the bit line BLZ to the sense amplifier 6. The sense amplifier 6 is then activated. Based on the cell information, the potential difference between output nodes BLZSA, BLXSA is amplified, and the cell information is respectively provided to the data buses DBZ, DBX via column gates 32a, 32b.

Then, the bit line separation switch 31b is activated, and the levels of the bit lines BLZ, BLX become complementary. After the sense amplifier 6 is deactivated, an equalizing switch 37 is activated by an equalizing signal ØBR, and the bit lines BLZ, BLX are reset at the same level, which is substantially equal to a median level between the sense amplifier voltages PSA, NSA.

During the burn-in test, the semiconductor memory device of the fourth embodiment controls the timing of control signals ØBT1, ØOBT2 to activate the bit line separation switches 31a, 31b. This provides a stress voltage to the bit lines BLZ, BLX from the sense amplifier 6.

Figure 14:
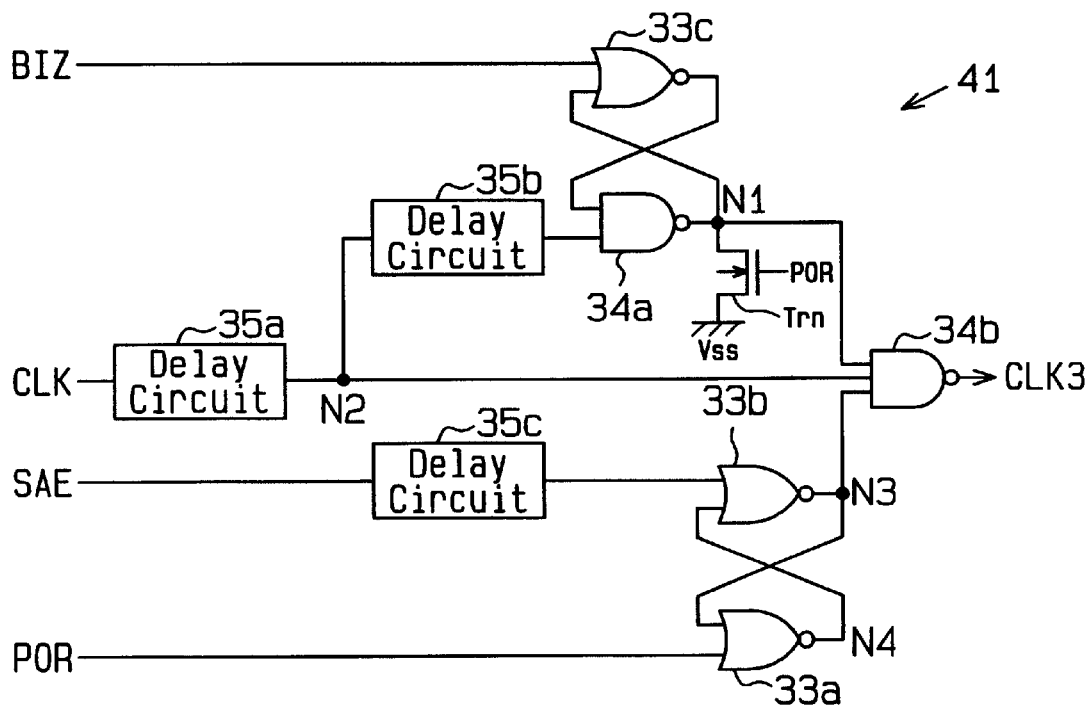
FIG. 14 is a circuit diagram of a first control circuit for controlling the memory array of FIG. 13.
Figure 15:
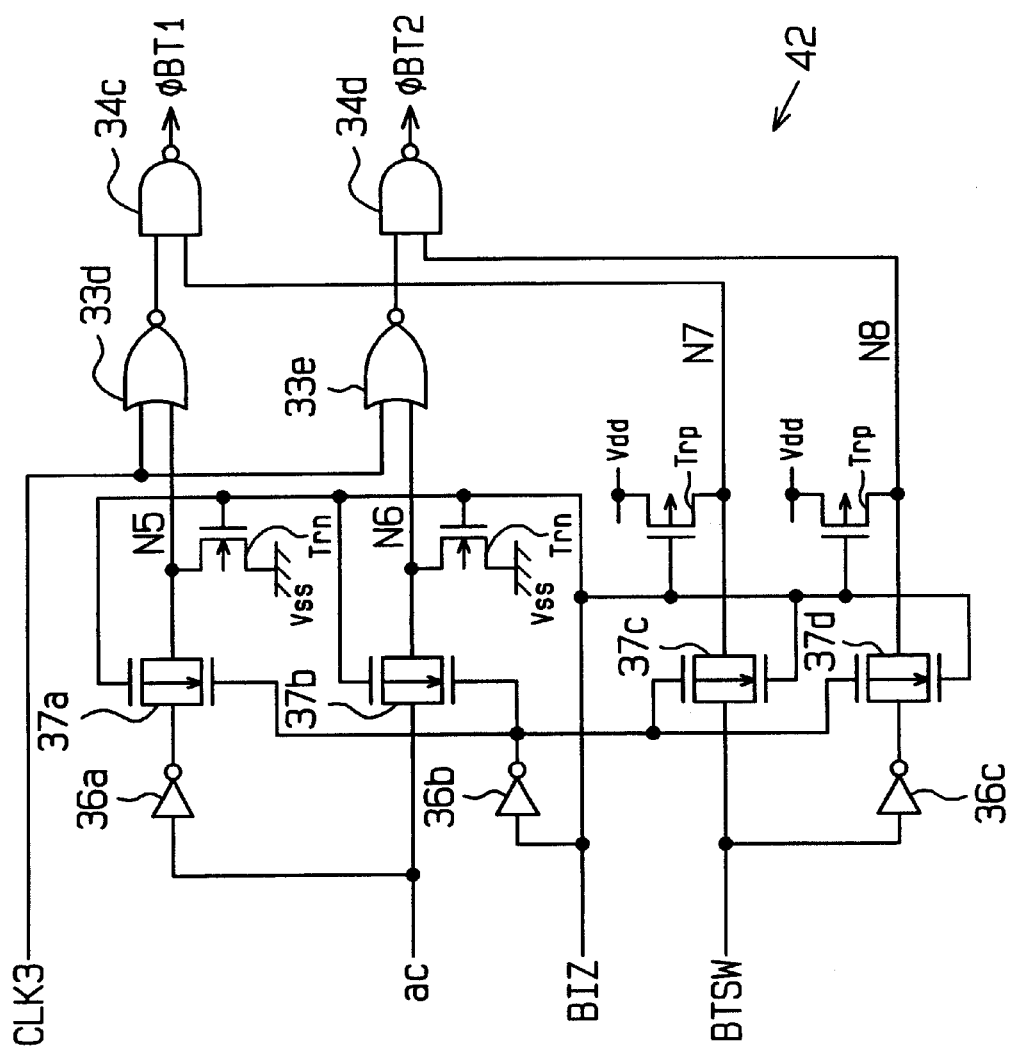
FIG. 15 is a circuit diagram of a second control circuit for controlling the memory array of FIG. 13.

FIGS. 14 and 15 respectively illustrate circuit diagrams of a first switch control circuit 41 and a second switch control circuit 42 for controlling the bit switches 31a, 31b of the memory cell array 400.

With reference to FIG. 14, a reset signal POR is provided to the first switch control circuit 41. A first input terminal of a NOR circuit 33a receives the reset signal POR. The output signal of the NOR circuit 33a is provided to a first input terminal of the NOR circuit 33b, and the output signal of the NOR circuit 33b is provided to a second input terminal of the NOR circuit 33a.

The reset signal POR goes high for a predetermined time when the semiconductor memory device is activated. The NOR circuits 33a, 33b constitute a latch circuit. When the semiconductor memory device is activated, the latch circuit resets node N4, which is the output terminal of the NOR circuit 33a, to a low level; and resets node N3, which is an output terminal of the NOR circuit 33b, to a high level.

The burn-in control signal BIZ is provided to a first input terminal of the NOR circuit 33c, and the output signal of the NOR circuit 33c is provided to a first input terminal of a NAND circuit 34a. The output signal of the NAND circuit 34a is provided to a second input terminal of the NOR circuit 33c.

Node N1, which is the output terminal of the NAND circuit 34a, is connected to the power supply Vss via an n-channel MOS transistor Trn. The gate of the transistor Trn receives the reset signal POR.

Accordingly, when the semiconductor memory device is activated, node N1 is reset to the low level. Further, when the burn-in control signal BIZ goes high, the NOR circuit 33c and the NAND circuit 34a latch node N1 at a high level.

A first input terminal of the NAND circuit 34b receives the master clock signal CLK via a first delay circuit 35a. The output signal of the first delay circuit 35a is provided to a second input terminal of the NAND circuit 34a via a second delay circuit 35b.

The first delay circuit 35a delays the master clock signal CLK by a predetermined time and outputs a signal having the same phase as the master clock signal CLK. The second delay circuit 35b further delays the delayed master clock signal CLK by another predetermined time and outputs a signal having a phase inverted from that of the master clock signal CLK.

The sense amplifier activation signal SAE is provided to a second input terminal of the NOR circuit 33b via a third delay circuit 35c. The third delay circuit 35c delays the activation signal SAE and outputs a signal having the same phase has the activation signal SAE.

The NAND circuit 34b receives the signals from nodes N1, N2, and N3, performs a NAND operation, and generates a third clock signal CLK3.

When the semiconductor memory device is activated, the levels at nodes N1, N2, and N3 are respectively low, indeterminate, and high. Thus, the third clock signal CLK3 is high.

Figure 16:
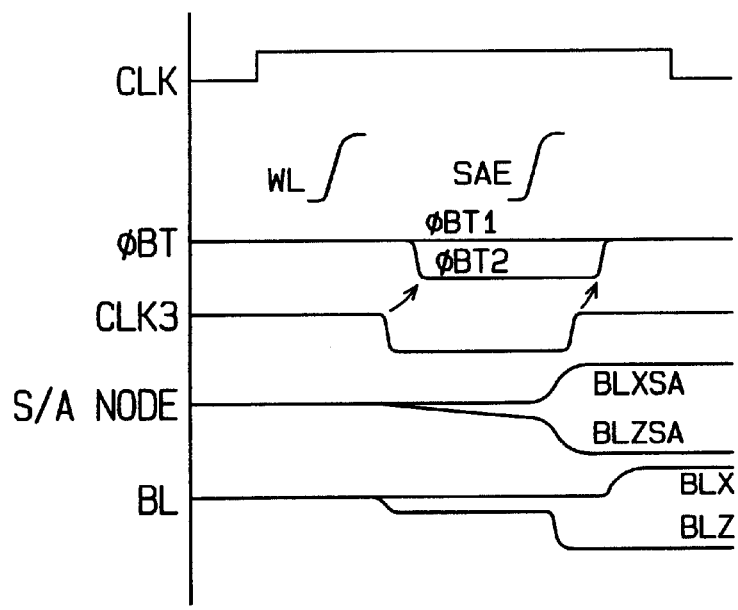
FIG. 16 is a combined timing and waveform chart illustrating the operation of the semiconductor memory device of FIG. 13 during a normal read operation.

FIG. 16 is a combined timing and waveform chart illustrating the normal read operation of the semiconductor memory device of the fourth embodiment.

During normal operations, the NOR circuit 33c of the first switch control circuit 41 (in FIG. 14) receives a low burn-in control signal BIZ, and the output signal of the NOR circuit 33c goes high. In this state, when the master clock signal CLK goes high, the first delay circuit 35a causes the level at node N2 to go high after a predetermined time from the time when the master clock signal CLK goes high.

Further, after a predetermined time has elapsed from the time when the level at node N2 goes high, the output signal of the second delay circuit 35b goes low, and the level at node N1 goes high.

With reference to FIG. 16, a predetermined word line WL is selected after a predetermined time elapses from when the master clock CLK goes high. Then, the third clock signal CLK3 goes low after a predetermined time elapses from when the word line WL is selected.

Then, when the sense amplifier activation signal SAE goes high, the output signal of the third delay circuit 35c goes high after a predetermined time elapses, and the level at node N3 goes low. This returns the third clock signal CLK3 to the high level. In other words, the sense amplifier activation signal SAE goes high, thereby activating the sense amplifier 6. Thus, after the potential difference between output nodes BLZSA, BLXSA of the sense amplifier 6 is increased, the third clock signal CLK3 returns to the high level.

In the second switch control circuit 42 of FIG. 15, the address determination signal ac goes high or low based on an address determination signal that selects word lines. In other words, the address determination signal ac goes low when the memory cell MC connected to the bit line BLZ is selected and goes high when the memory cell MC connected to the bit line BLX is selected.

The address determination signal ac is provided to a first input terminal of a NOR circuit 33d via an inverter circuit 36a and a transfer gate 37a. The address determination signal ac is also provided to a first input terminal of a NOR circuit 33e via a transfer gate 37b.

The p-channel gates of the transfer gates 37a, 37b receive the burn-in control signal BIZ. The n-channel gates of the transfer gates 37a, 37b receive the burn-in control signal BIZ via an inverter circuit 36b.

Accordingly, the transfer gates 37a, 37b are deactivated when the burn-in control signal BIZ goes high, and the transfer gates 37a, 37b are activated when the burn-in control signal BIZ goes low. The third clock signal CLK3 is received by second input terminals of the NOR circuits 33d, 33e.

A switch selection signal BTSW is provided to a first input terminal of a NAND circuit 34c via a transfer gate 37c. The switch selection signal BTSW is also provided to a first input terminal of a NAND circuit 34d via an inverter circuit 36c and a transfer gate 37d.

The n-channel gates of the transfer gates 37c, 37d receive the burn-in control signal BIZ. The p-channel gates of the transfer gates 37c, 37d receive the burn-in control signal BIZ via the inverter circuit 36b.

Therefore, when the burn-in control signal BIZ goes high, the transfer gates 37a, 37b are activated. When the burn-in control signal BIZ goes low, the transfer gates 37a, 37b are deactivated.

Nodes N5, N6, which are the output terminals of the transfer gates 37a, 37b respectively, are each connected to the power supply Vss via an n-channel MOS transistor Trn. The gate of the transistor Trn receives the burn-in control signal BIZ. Accordingly, when the burn-in control signal BIZ goes high, the levels at the nodes N5, N6 go low.

Nodes N7, N8, which are the output terminals of the transfer gates 37c, 37d respectively, are each connected to the power supply Vdd via a p-channel MOS transistor Trp. The gate of the transistor Trp receives the burn-in control signal BIZ. Accordingly, when the burn-in control signal BIZ goes low, the levels at the nodes N7, N8 go high.

The output signal of the NOR circuit 33d is provided to a second input terminal of the NAND circuit 34c. The output signal of the NOR circuit 33e is provided to a second input terminal of the NAND circuit 34d. The NAND circuits 34c, 34d output bit line control signals ØBT1, ØBT2, respectively.

In the second switch control circuit 42, when the burn-in control signal BIZ is low during normal operation, the transfer gates 37a, 37b are activated, and the transfer gates 37c, 37d are deactivated. Further, the transistor Trp is activated, and the levels at nodes N7, N8 go high.

When the clock signal CLK3 goes high, the output signals of the NOR circuits 33d, 33e both go low, and the bit line control signals ØBT1, ØBT2 both go high. When the third clock signal CLK3 goes low, based on the address determination signal ac, one of the bit line control signals ØBT1, ØBT2 goes high, while the other one of the bit line control signals ØBT1, ØBT2 goes low.

When performing the burn-in test, the burn-in control signal BIZ goes high. This activates the transfer gates 37c, 37d and deactivates the transfer gates 37a, 37b. Further, the transistor Trn is activated and the levels at nodes N5, N6 go low.

When the third clock signal CLK3 goes high, the output signals of the NOR circuits 33d, 33e both go low and the bit line control signals ØBT1, ØBT2 both go high. Further, when the third clock signal CLK3 goes low, based on the switch selection signal BTWS, one of the bit line control signals ØBT1, ØBT2 goes high, while the other one of the bit line control signals ØBT1, ØBT2 goes low.

Figure 17:
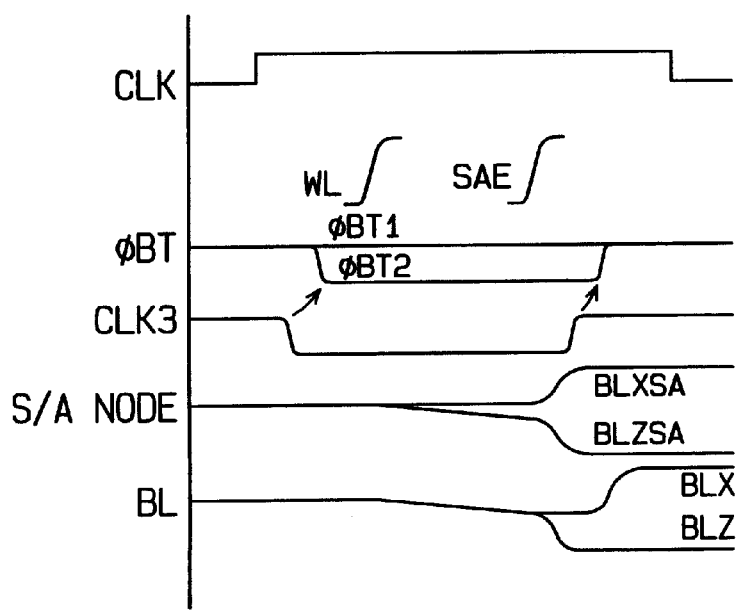
FIG. 17 is a combined timing and waveform chart illustrating the operation of the semiconductor memory device of FIG. 13 during a burn-in test.

The burn-in operation of the fourth embodiment will now be described. FIG. 17 is a combined timing and waveform chart illustrating the operation of the semiconductor memory device (DRAM) of the fourth embodiment during the burn-in test.

After the DRAM is activated, when the burn-in control signal BIZ provided to the DRAM goes high and the burn-in operation starts, the bit line control signals ØBT1, ØBT2 both go high. Thus, the bit line separations switches 31a, 31b are both activated. Further, the equalizing signal ØBR activates the equalizing switch 37, and the bit lines BLZ, BLX are precharged to the median potential.

In this state, when the master clock signal CLK goes high, the third clock signal CLK3 goes low after a predetermined delay time, which is determined by the delay circuit 35a. If the second switch control circuit 42 receives a low switch selection signal BTSW, the bit line control signal ØBT1 goes high and the bit line control signal ØBT2 goes low. As a result, the bit line separation switch 31a is activated and the bit line separation switch 31b is deactivated.

Then, all of the word lines WL are selected and cell information is read from the memory cells connected to the bit lines BLZ, BLX. In this state, all of the memory cells MC have not yet completed the writing operation and the capacitors of the memory cells MC have not yet fully stored charge. Thus, the potentials at the bit lines BLZ, BLX both decrease from the median level. Since the bit line BLZ is connected to the sense amplifier 6, only the potential at the output node BLZSA of the sense amplifier 6 decreases. This produces a small potential difference between the output nodes BLZSA, BLXSA of the sense amplifier 6.

Then, when the sense amplifier activation signal SAE goes high and a stress voltage (sense amplifier voltages PSA, NSA) is provided to the sense amplifier 6, the levels at the output node BLSZA of the sense amplifier 6 and the bit line BLZ decrease to the level of the sense amplifier voltage NSA, and the level at the output node BLXSA increases to the level of the sense amplifier voltage PSA.

Then, when the third clock signal CLK3 goes high, the bit line control signal ØBT2 goes high and activates the bit line separation switch 31b. This increases the bit line BLX to the level of the sense amplifier voltage PSA and provides a stress voltage between the bit lines BLZ, BLX.

If the master clock signal CLK goes high when the switch selection switch BTSW provided to the second switch control circuit 42 is high, the switch control signal ØBT1 goes low and the switch control signal ØBT2 goes high when the third clock signal CLK3 goes low. As a result, a stress voltage having a polarity that is inverted from that when the switch selection signal BTSW is low is provided between the bit lines BLZ, BLX.

FIG. 16 illustrates the normal read operation performed when the DRAM receives the low burn-in control signal BIZ. FIG. 16 illustrates an example when the cell information of "0" is read from the memory cell connected to the bit line BLZ.

After a predetermined time elapses from the time when the master clock signal CLK goes high, one of the word lines WL is selected and cell information is read to one of the bit lines BLZ, BLX. Then, the third clock signal CLK3 goes low in correspondence with the operations of the first and second delay circuits 35a, 35b.

Based on the address determination signal ac, one of the bit line control signals ØBT1, ØBT2 (in FIG. 16, ØBT2) goes low. Thus, only the bit line from which cell information is being read is connected to the sense amplifier 6 by the associated bit line separation switch.

Then, the sense amplifier activation signal SAE goes high, the read information is amplified. When the third clock signal CLK3 goes high, the bit line control signals ØBT1, ØBT2 both return to the high level. In this state, the potential difference between the bit lines BLZ, BLX is increased, and the read cell information is output to the data buses DBZ, DBX.

Then, the sense amplifier 6 is deactivated and the bit lines BLZ, BLX are reset to the median potential. The normal read operation is performed by repeating such procedures.

The fourth embodiment has the advantages described below.

(1) The semiconductor memory device generates a stress voltage based on the burn-in control signal BIZ and the master clock signal CLK. The stress voltage is provided to the sense amplifier 6 to perform the burn-in test.

(2) During the burn-in test, the selection signal BTSW is switched to the high level or the low level. This selects one of the bit lines BLZ, BLX that is to have the high potential.

(3) A switch circuit for providing a stress voltage to the vicinity of the bit lines BLZ, BLX and a signal line for controlling the switch circuit is not necessary. Thus, the circuit area of the memory cell array 400 is decreased.

(4) A stable stress voltage is provided to the bit lines BLZ, BLX by the sense amplifier 6. Thus, the reliability of the burn-in test is increased.

[Fifth Embodiment]

Figure 18:
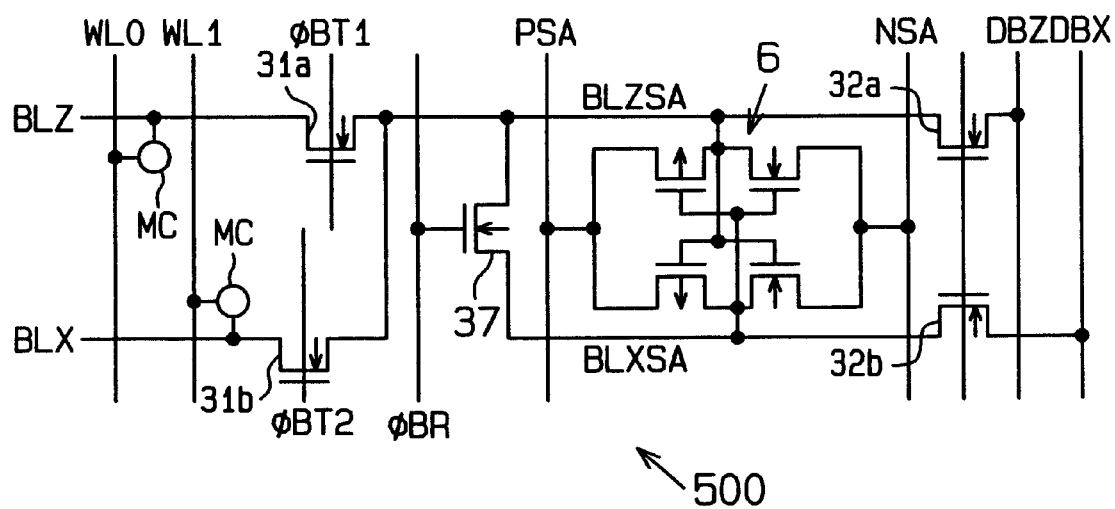
FIG. 18 is a schematic block circuit diagram of a section of a memory array in a semiconductor memory device according to a fifth embodiment of the present invention.

FIG. 18 is a schematic circuit diagram of a memory cell array 500 of a semiconductor memory device according to a fifth embodiment of the present invention.

The memory cell array 500 of the fifth embodiment differs from the memory cell array 400 of the fourth embodiment only in that the bit line BLX is connected to the output node BLZSA of the sense amplifier 6 by the bit line separation switch 31b.

In the same manner as the fourth embodiment, the burn-in test is performed based on the operations of the first switch control circuit 41 of FIG. 14 and the second switch control circuit 42 of FIG. 15. However, in the fifth embodiment, the cell information read from the bit lines BLZ, BLX is provided to the output node BLZSA of the sense amplifier 6. Thus, prior to the burn-in test, different cell information is written to the memory cell MC connected to the bit line BLZ and to the memory cell connected to the bit line BLX respectively. One of the bit lines BLZ, BLX that is to have the high potential is selected based on the switch selection signal BTSW, so to provide a stress voltage between the bit lines BLZ, BLX.

It should be apparent to those skilled in the art that the present invention may be embodied in many other alternative forms without departing from the principle and the scope of the invention. Particularly, it should be understood that the present invention may be embodied in the following forms.

In the semiconductor memory device 100 of the first embodiment, during the burn-in test, a word line other than the dummy word line may be selected to produce a small potential difference between the bit lines BLZ, BLX based on the cell information of the memory cell connected to the selected word line.

In the semiconductor memory device of the fourth and fifth embodiment, after all of the word lines become non-selected, the sense amplifier activation signal SAE may go high and a stress voltage may be provided to the sense amplifier 6.

The present examples and embodiments are to be considered as illustrative and not restrictive, and the invention is not to be limited to the details given herein, but may be modified within the scope and equivalence of the appended claims.

What is claimed is:

1. A semiconductor memory device comprising:
   a plurality of word lines including first word lines;
   pairs of bit lines intersecting the plurality of word lines;
   a plurality of memory cells located at the intersections between the plurality of word lines and the pairs of bit lines;
   a plurality of sense amplifiers, each connected to one of the pairs of bit lines for amplifying a potential difference between the associated pair of bit lines; and
   a burn-in test control circuit for providing a stress voltage to the plurality of word lines and the pairs of bit lines to perform a burn-in test based on a burn-in control signal, wherein the burn-in test control circuit includes a potential difference setting circuit for selecting at least one of the first word lines before selection of the plurality of word lines to generate a potential difference between at least one of the pairs of bit lines based on the burn-in control signal, and wherein each of the sense amplifiers amplifies the potential difference to provide the stress voltage between the plurality of word lines and the associated pair of bit lines and between the associated pair of bit lines.

2. The semiconductor memory device according to claim 1 further comprising:
   a dummy cell connected to each intersection between the first word lines and the bit lines, wherein the first word lines are dummy word lines, and wherein the potential difference setting circuit includes the dummy words lines, the dummy cells, and a dummy word control circuit for selecting at least one of the dummy word lines before selection of the plurality of word lines to generate a potential difference corresponding to the dummy cells between the at least one of the pairs of bit lines based on the burn-in control signal.

3. The semiconductor memory device according to claim 2, further comprising:
   a word decoder driver connected to the plurality of word lines for selecting at least one of the plurality of word lines, wherein the word decoder driver includes a predecoder for simultaneously selecting all of the plurality of word lines based on the burn-in control signal.

4. The semiconductor memory device according to claim 2, wherein the dummy word control circuit selects one of the dummy word lines based on a selection signal.

5. The semiconductor memory device according to claim 2, wherein the memory cells each include a capacitor, and the dummy cells comprise coupling capacitors, and wherein each of the coupling capacitors has a capacitance smaller than that of the capacitor of one of the memory cells.

6. The semiconductor memory device according to claim 2, wherein the memory cells each include a capacitor, and the dummy cells each include a transistor and a capacitor, and wherein the capacitor of one of the dummy cells has a capacitance smaller than that of the capacitor of one of the memory cells.

7. The semiconductor memory device according to claim 1, further comprising a word decoder driver for selecting at least one of the plurality of word lines, wherein the word decoder driver includes a predecoder for simultaneously selecting all of the plurality of word lines based on the burn-in control signal.

8. A semiconductor memory device comprising:
   a plurality of words lines;
   pairs of bit lines intersecting the word lines;
   a plurality of memory cells located at the intersections between the word lines and the pairs of bit lines;
   a plurality of sense amplifiers, each connected to one of the pairs of bit lines for amplifying a potential difference between the associated pair of bit lines;
   a plurality of column gates, each connected to one of the pairs of bit lines;
   a plurality of data buses connected via the column gates to the pairs of bit lines; and
   a burn-in test control circuit for providing a stress voltage to the word lines and the pairs of bit lines so to perform a burn-in test based on a burn-in control signal, wherein the burn-in test control circuit includes:
      a potential generation circuit connected to the plurality of data buses for generating a potential difference between the plurality of data buses based on the burn-in control signal; and
      a column decoder connected to the column gates to connect the plurality of data buses to the pairs of bit lines based on the burn-in control signal, wherein each of the sense amplifiers amplifies the potential difference to provide the stress voltage between the plurality of word lines and the associated pair of bit lines and between the associated pair of bit lines.

9. The semiconductor memory device according to claim 8, wherein the plurality of data buses include a pair of local data buses connected to the plurality of bit lines and a pair of global data buses connected to the pair of local data buses, and wherein the potential generation circuit is connected to each of the pair of local data buses.

10. The semiconductor memory device according to claim 9, wherein the potential generation circuit selectively provides a first potential and a second potential to the pair of local data buses based on a selection signal.

11. The semiconductor memory device according to claim 9, wherein the potential generation circuit is a local equalizer for providing a precharge voltage to one of the pair of local data buses based on the burn-in control signal.

12. The semiconductor memory device according to claim 8, wherein the plurality of data buses include a pair of local data buses connected to the plurality of bit lines and a pair of global data buses connected to the pair of local data buses, wherein the potential generation circuit is connected to the pair of global data buses.

13. The semiconductor memory device according to claim 12, wherein the potential generation circuit selectively provides a first potential and a second potential to the pair of global data buses based on a selection signal.

14. The semiconductor memory device according to claim 12, wherein the potential generation circuit is a global equalizer for providing a precharge voltage to one of the pair of global data buses based on the burn-in control signal.

15. A semiconductor memory device comprising:

a plurality of words lines;

pairs of bit lines intersecting the word lines;

a plurality of memory cells located at the intersections between the word lines and the pairs of bit lines;

a plurality of sense amplifiers, each connected to one of the pairs of bit lines for amplifying a potential difference between the associated pair of bit lines, wherein each of the sense amplifiers includes a pair of input nodes;

plural sets of bit line separation switches, each connected between the associated pair of bit lines and the pair of input nodes of the associated sense amplifier; and a burn-in test control circuit for providing a stress voltage to the plurality of word lines and the pairs of bit lines to perform a burn-in test based on a burn-in control signal, wherein the burn-in test control circuit includes a switch control circuit for selectively activating one set of the bit line separation switches associated with one of the pairs of bit lines based on the burn-in control signal before selection of the word lines, so to produce a potential difference between the input nodes of the sense amplifier associated with the set of the bit line separation switches.

16. The semiconductor memory device according to claim 15, wherein the switch control circuit selectively activates the one set of the bit line separation switches based on a switch selection signal and selectively provides a first potential and a second potential to the pair of input nodes.

17. A method for setting a stress voltage applied to a semiconductor memory device, wherein the semiconductor memory device includes a plurality of word lines, pairs of bit lines intersecting the word lines, a plurality of dummy word lines intersecting the pairs of bit lines, and a plurality of sense amplifiers each connected to one of the pairs of bit lines for amplifying a potential difference between the associated pair of bit lines, the method comprising the steps of:

selecting at least one of the dummy word lines;

producing a potential difference between at least one of the pairs of bit lines;

amplifying the potential difference by activating the sense amplifier associated with the at least one of the pairs of bit lines;

selecting all of the word lines; and providing a stress voltage between all of the word lines and the at least one of the pairs of bit lines and between the at least one of the pairs of bit lines.

18. A method for setting a stress voltage applied to a semiconductor memory device, wherein the semiconductor memory device includes a plurality of word lines, pairs of bit lines intersecting the word lines, a plurality of dummy word lines intersecting the pairs of bit lines, a plurality of sense amplifiers each connected to one of the pairs of bit lines for amplifying a potential difference between the associated pair of bit lines, and a pair of data buses connected via the column gates to the pairs of bit lines, the method comprising the steps of:

generating a potential difference between the pair of data buses;

providing the potential difference to the pairs of bit lines by connecting the pair of data buses to the pairs of bit lines;

amplifying the potential difference by activating the sense amplifiers;

selecting all of the word lines; and providing a stress voltage between all of the word lines and the pairs of bit lines and between the pairs of bit lines.

19. A method for setting a stress voltage applied to a semiconductor memory device, wherein the semiconductor memory device includes a plurality of word lines, pairs of bit lines intersecting the word lines, a plurality of dummy word lines intersecting the pairs of bit lines, a plurality of sense amplifiers each having a pair of input nodes and connected to one of the pairs of bit lines for amplifying a potential difference between the associated pair of bit lines, and plural sets of bit line separation switches each connected to one of the pairs of bit lines and to the pair of input nodes of the associated sense amplifier, the method comprising:

activating one set of the bit line separation switches associated with one of the pairs of bit lines to produce a potential difference between the pair of the input nodes of the sense amplifier associated with the one set of the bit line separation switches;

selecting all of the word lines;

amplifying the potential difference by activating the sense amplifier associated with the one set of the bit line separation switches; and providing a stress voltage between all of the word lines and one of the pairs of bit lines and between the pairs of bit lines by activating the one set of the bit line separation switches.

* * * * *

UNITED STATES PATENT AND TRADEMARK OFFICE
CERTIFICATE OF CORRECTION

PATENT NO. : 6,297,999 B2
DATED : October 2, 2001
INVENTOR(S) : Yoshiharu Kato et al.

It is certified that error appears in the above-identified patent and that said Letters Patent is hereby corrected as shown below:

<u>Title page,</u>
Please change the following information:

Foreign Application Priority Data
"Feb. 18, 2000 (JP) ............................................. 12-041622" to
-- Feb. 18, 2000 (JP) ............................................. 2000-041622 --

Signed and Sealed this

Seventh Day of May, 2002

Attest:

JAMES E. ROGAN
*Attesting Officer*     *Director of the United States Patent and Trademark Office*